United States Patent
Then et al.

(10) Patent No.: US 11,489,061 B2
(45) Date of Patent: Nov. 1, 2022

(54) INTEGRATED PROGRAMMABLE GATE RADIO FREQUENCY (RF) SWITCH

(71) Applicant: Intel Corporation, Santa Clara, CA (US)

(72) Inventors: Han Wui Then, Portland, OR (US); Marko Radosavljevic, Portland, OR (US); Sansaptak Dusgupta, Hillsboro, OR (US); Paul Fischer, Portland, OR (US); Walid Hafez, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 866 days.

(21) Appl. No.: 16/139,248

(22) Filed: Sep. 24, 2018

(65) Prior Publication Data

US 2020/0098885 A1    Mar. 26, 2020

(51) Int. Cl.
*H01L 29/51* (2006.01)
*H01L 29/423* (2006.01)
(Continued)

(52) U.S. Cl.
CPC .......... *H01L 29/513* (2013.01); *H01L 21/022* (2013.01); *H01L 21/28158* (2013.01);
(Continued)

(58) Field of Classification Search
CPC . H01L 29/518; H01L 29/778; H01L 29/7786; H01L 21/28158; H01L 29/66522; H01L 21/022; H01L 29/66545; H01L 29/2003; H01L 29/513; H01L 29/42364; H01L 29/0657; H01L 29/78; H01L 29/517; H01L 21/28264; H01L 29/4236; H01L 29/0847; H01L 29/66462; H01L 21/02164; H01L 21/02178; H01L 21/0228; H01L 29/7783; H01L 21/02356; H01L 21/02271; H01L 29/42376; H01L 29/41758; H01L 29/432; H01L 29/205; H01L 29/7787; H01L 29/408; H01L 29/78391; H01L 29/24; H01L 29/1095; H01L 29/086; H01L 29/7395; H01L 29/7391; H01L 29/045; H01L 29/51; H01L 29/7828; H01L 29/7802; H01L 29/1608; H01L 29/7813; H01L 29/6606; H01L 29/94
See application file for complete search history.

(56) References Cited

U.S. PATENT DOCUMENTS

2003/0151948 A1* 8/2003 Bhattacharyya ............ H01L 29/42332
365/185.18
2003/0160265 A1* 8/2003 Inoue .................... H01L 29/513
257/189

(Continued)

*Primary Examiner* — Mouloucoulaye Inoussa
(74) *Attorney, Agent, or Firm* — Schwabe, Williamson & Wyatt, P.C.

(57) ABSTRACT

A transistor comprises a base layer that includes a channel region, wherein the base layer and the channel region include group III-V semiconductor material. A gate stack is above the channel region, the gate stack comprises a gate electrode and a composite gate dielectric stack, wherein the composite gate dielectric stack comprises a first large bandgap oxide layer, a low bandgap oxide layer, and a second large bandgap oxide layer to provide a programmable voltage threshold. Source and drain regions are adjacent to the channel region.

18 Claims, 9 Drawing Sheets

(51) Int. Cl.
*H01L 29/778* (2006.01)
*H01L 21/02* (2006.01)
*H01L 29/66* (2006.01)
*H01L 21/28* (2006.01)
*H01L 29/78* (2006.01)

(52) U.S. Cl.
CPC .... *H01L 29/4236* (2013.01); *H01L 29/42364* (2013.01); *H01L 29/66522* (2013.01); *H01L 29/778* (2013.01); *H01L 29/78* (2013.01)

(56) References Cited

U.S. PATENT DOCUMENTS

| | | | |
|---|---|---|---|
| 2005/0023555 A1* | 2/2005 | Yoshida | H01L 29/7789 257/192 |
| 2005/0173755 A1* | 8/2005 | Forbes | H01L 21/28194 257/316 |
| 2007/0045711 A1* | 3/2007 | Bhattacharyya | H01L 29/42348 257/315 |
| 2007/0045718 A1* | 3/2007 | Bhattacharyya | H01L 29/42332 257/324 |
| 2007/0215929 A1* | 9/2007 | Yasuda | H01L 29/42324 257/347 |
| 2007/0232041 A1* | 10/2007 | Choi | H01L 29/40114 438/585 |
| 2008/0099829 A1* | 5/2008 | Forbes | H01L 29/513 257/324 |
| 2008/0237636 A1* | 10/2008 | Jin | H01L 29/7843 257/190 |
| 2008/0237688 A1* | 10/2008 | Yasuda | H01L 29/513 257/316 |
| 2008/0237694 A1* | 10/2008 | Specht | G11C 16/0466 257/324 |
| 2008/0237697 A1* | 10/2008 | Shimizu | H01L 29/66833 257/325 |
| 2008/0246078 A1* | 10/2008 | Huo | H01L 29/40114 257/324 |
| 2009/0050953 A1* | 2/2009 | Wang | H01L 29/513 257/324 |
| 2010/0012977 A1* | 1/2010 | Derluyn | H01L 29/7783 257/E21.403 |
| 2010/0072539 A1* | 3/2010 | Yasuda | H01L 29/517 257/326 |
| 2010/0314679 A1* | 12/2010 | Lee | H01L 29/42332 257/324 |
| 2011/0147706 A1* | 6/2011 | Radosavljevic | H01L 29/7782 257/E21.403 |
| 2011/0233655 A1* | 9/2011 | Shimizu | H01L 29/66833 257/E21.21 |
| 2012/0126295 A1* | 5/2012 | Edge | H01L 29/66545 257/288 |
| 2012/0161223 A1* | 6/2012 | Bhattacharyya | H01L 29/511 257/324 |
| 2013/0099284 A1* | 4/2013 | Tserng | H01L 29/402 257/E21.403 |
| 2013/0105812 A1* | 5/2013 | Ishigaki | H01L 29/4236 257/76 |
| 2013/0334538 A1* | 12/2013 | Saunier | H01L 29/7787 257/76 |
| 2014/0151747 A1* | 6/2014 | Jeon | H01L 29/42316 257/194 |
| 2015/0221758 A1* | 8/2015 | Miura | H01L 29/4175 257/76 |
| 2015/0357429 A1* | 12/2015 | Dubourdieu | H01L 29/516 257/295 |
| 2015/0357454 A1* | 12/2015 | Lutgen | H01L 29/2003 257/76 |
| 2017/0207214 A1* | 7/2017 | Or-Bach | H01L 27/0694 |
| 2017/0213821 A1* | 7/2017 | Or-Bach | H01L 21/76254 |
| 2019/0058049 A1* | 2/2019 | Then | H01L 29/2003 |
| 2019/0074174 A1* | 3/2019 | Okamoto | H01L 29/66462 |
| 2019/0198631 A1* | 6/2019 | Bhattacharyya | H01L 27/11568 |
| 2019/0221660 A1* | 7/2019 | Dasgupta | H01L 29/7786 |

\* cited by examiner

INTEGRATED PROGRAMMABLE GATE RADIO FREQUENCY (RF) SWITCH

TECHNICAL FIELD

Embodiments of the disclosure are in the field of integrated circuit structures and, in particular, integrated programmable gate RF Switch.

BACKGROUND

In the fields of wireless communication and power management, various components can be implemented using semiconductor devices such as transistors. For example, in radio frequency (RF) communication, the RF front end is a generic term for the circuitry between an antenna and a digital baseband system and the RF front end may include multiple transistor-based components, such as switches and amplifiers, to name some examples. Semiconductor devices are electronic components that exploit the electronic properties of semiconductor materials, such as silicon (Si), germanium (Ge), and gallium arsenide (GaAs), to name a few examples. A field-effect transistor (FET) is a semiconductor device that includes three terminals: a gate, a source, and a drain. A FET uses an electric field applied by the gate to control the electrical conductivity of a channel through which charge carriers (e.g., electrons or holes) flow from the source to the drain. Some FETs have a fourth terminal called, the body or substrate, which can be used to bias the transistor.

A metal-oxide-semiconductor FET (MOSFET) is configured with an insulator between the gate and the body of the transistor, and MOSFETs are commonly used for amplifying or switching electronic signals. For example, MOSFETs have been used to implement RF switches, which is used route high frequency signals through transmission paths. For RF switch applications, the transistor threshold voltage (VT) is typically fixed for a given technology. Because of the fixed the VT, transistor ON resistance, must always be traded off with OFF state headroom.

DESCRIPTION OF THE EMBODIMENTS

Figure 1:
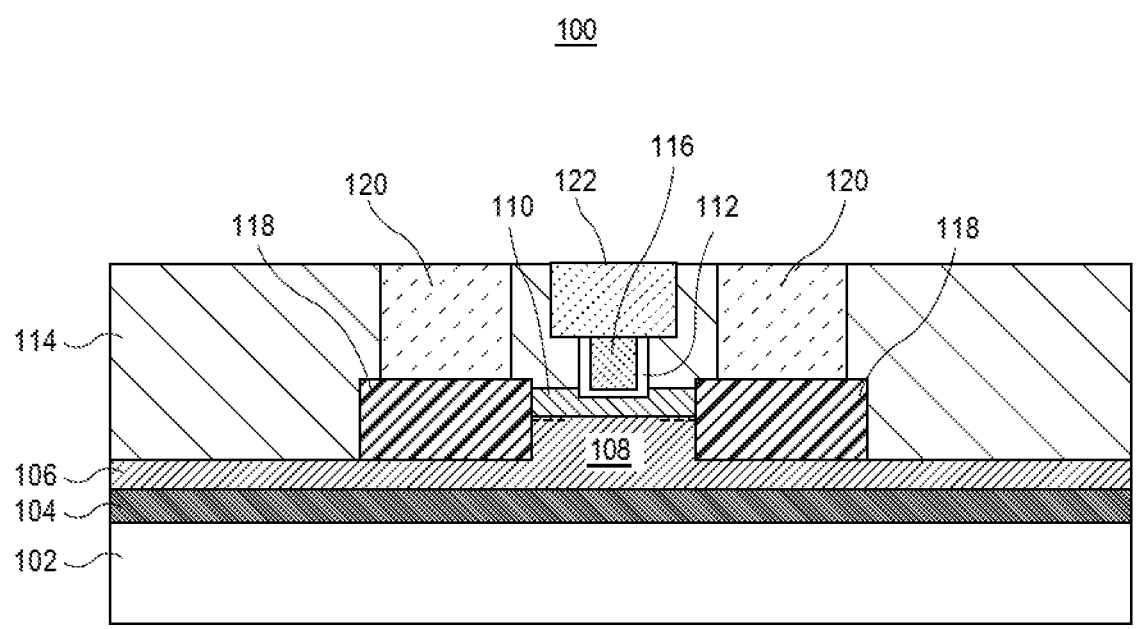
FIG. 1 illustrates a conventional RF switch field effect transistor (FET) comprising gallium nitride (GaN).

Integrated programmable gate RF Switches are described. In the following description, numerous specific details are set forth, such as specific material and tooling regimes, in order to provide a thorough understanding of embodiments of the present disclosure. It will be apparent to one skilled in the art that embodiments of the present disclosure may be practiced without these specific details. In other instances, well-known features, such as single or dual damascene processing, are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

One or more embodiments described herein are directed to structures and architectures for fabricating an integrated programmable gate RF switch. The VT of the programmable gate switch is able to be set and reset prior to turning ON or OFF the RF switch to achieve improved RF switch performance. In one embodiment, the composite gate dielectric stack comprises a first large bandgap oxide layer, a low bandgap oxide layer, and a second large bandgap oxide layer. Embodiments may include or pertain to one or more of GaN transistors, composite gate oxide stacks, and single gate transistors with programmable VT. One or more embodiments may be implemented to realize high performance RF switch applications of future technology nodes.

To provide context, FIG. 1 illustrates a conventional RF switch field effect transistor (FET) comprising gallium nitride (GaN). The RF switch FET 100 includes a base substrate 102 and a GaN layer 106 over the substrate. In-between the GaN layer 106 and the substrate 102 is a buffer layer 104 that is epitaxially grown on the substrate 102. In the case where the substrate 120 is a non-III-V material (e.g., Si, Ge, SiGe, SiC, or sapphire substrate), the buffer layer 104 may act to improve growth conditions and/or prevent the III-V GaN layer 106 from reacting with the non-III-V substrate material. In one embodiment, the buffer layer 104 may comprise a group III-V nitride in a composition of the aluminum, gallium or indium and a group V nitride, e.g. layers of aluminum nitride and aluminum gallium nitride.

The GaN layer 106 forms the channel region 108 of the RF switch FET 100, and over the GaN layer 106 is an epitaxially grown polarization layer 110. The polarization layer 110 may include any suitable materials, such as one or more III-V materials, and may increase carrier mobility in the transistor channel region 108 and/or be used to form a quantum well at the interface between the GaN layer 106 and polarization layer 110.

Within a recess of the polarization layer 110 and an insulating layer 114, is a gate dielectric layer 112. The gate dielectric layer 112 may include any suitable material, such as silicon dioxide and/or high-k dielectric material. A gate electrode 116 is formed on within the boundaries formed by the gate dielectric layer 112. Gate electrode 116 may include any suitable material, such as polysilicon, silicon nitride, silicon carbide, and/or various suitable metal material, such as aluminum (Al), tungsten (W), titanium (Ti), tantalum (Ta), copper (Cu), titanium nitride (TiN), or tantalum nitride (TaN), for example. Source/drain regions 118 are formed on opposite sides of the polarization layer 110 and the channel region 108, and are epitaxially grown from the polarization layer 110. The RF switch FET 100 further includes source/drain contacts 120 and a gate contact 122 formed through the insulating layer 114 and in contact with the source/drain regions 118 and the gate electrode 116, respectively.

The recess is formed on the top of the polarization layer 110 through etching, and the depth of the recess controls the threshold voltage (VT) of the RF switch FET 100. If there is no recess in the polarization layer 110, VT will be very low or even negative. A deeper recess means bringing the gate closer to the channel, in which case the VT of the channel would be higher. A conventional RF switch FET 100 is implemented with a fixed VT, whether the transistor is in the ON state or in the OFF state.

Figure 2A:
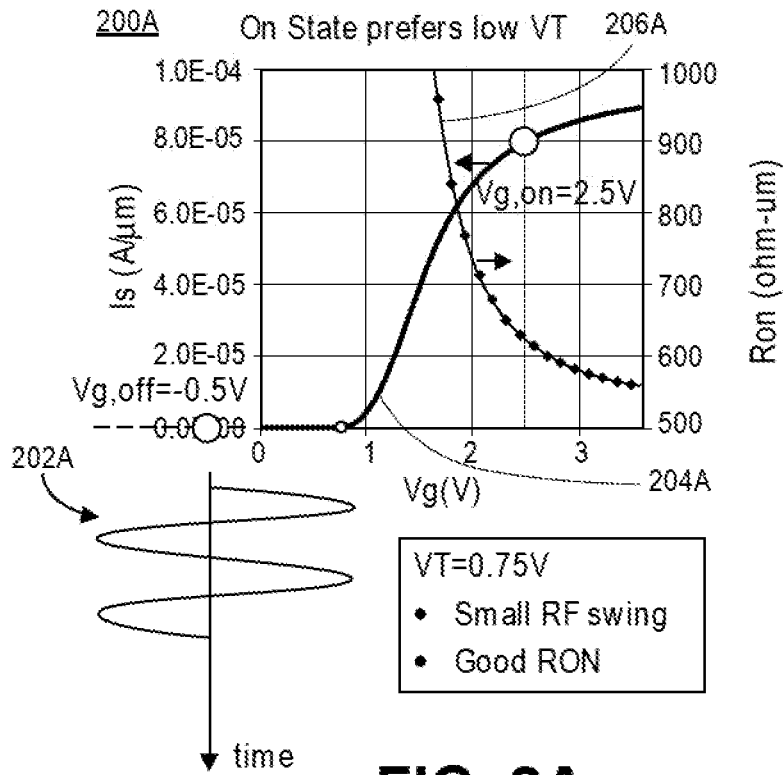
FIG. 2A illustrates a FET Is-Vg curve plot for a conventional FET having a threshold voltage (VT) of 0.75 V.

FIG. 2A illustrates a FET Is-Vg curve plot 200A for a conventional FET having a threshold voltage (VT) of 0.75 V. The y-axis represents both transistor source current (Is) (in amps/microns) and ON state resistance (Ron) (in ohm-microns). The x-axis represents transistor gate voltage (Vg). A graph is also shown of the maximum RF swing voltage 202A over time. In operation, an RF signal is input to the drain of the FET and the output signal goes through the transistor source, and vice versa. The FET functions to either allow an incoming RF signal to pass through the FET while in the ON state, or to block the incoming RF signal in the OFF state. The curve plot 200A illustrates that when the RF switch FET is biased in the ON state, the FET prefers a low voltage threshold (VT) of 0.75 V. The voltage supply for the FET is fixed at −0.5 V for the OFF state Vg (Vg,off), and 2.5 V for the ON state Vg (Vg,on). In this example case, the maximum RF swing voltage during the OFF state has a peak-to-peak amplitude of 2(VT−Vg,off)=2(0.75 V−(−0.5 V))=2.5V. A corresponding illustration of the maximum RF swing voltage 202A, which oscillates over time. With a low VT of 0.75 V, the FET is capable of handling small RF swings. When the value of Vg rises past the VT value of 0.75V, the FET enters ON state, and the Is value shown by curve 204A rises higher than zero. The ON state resistance (Ron) is shown by curve 206A and is only defined while the FET is the ON state. Ron starts at a value of approximately 1000 ohms/μm, and then decreases as Vg increases. Once Vg,on reaches 2.5 V, the Ron value is approximately 620 ohms/μm. Ron is relatively good or suitable in this example case because of the large Vg,on−VT value, which is 2.5 V−0.75 V=1.75 V.

Figure 2B:
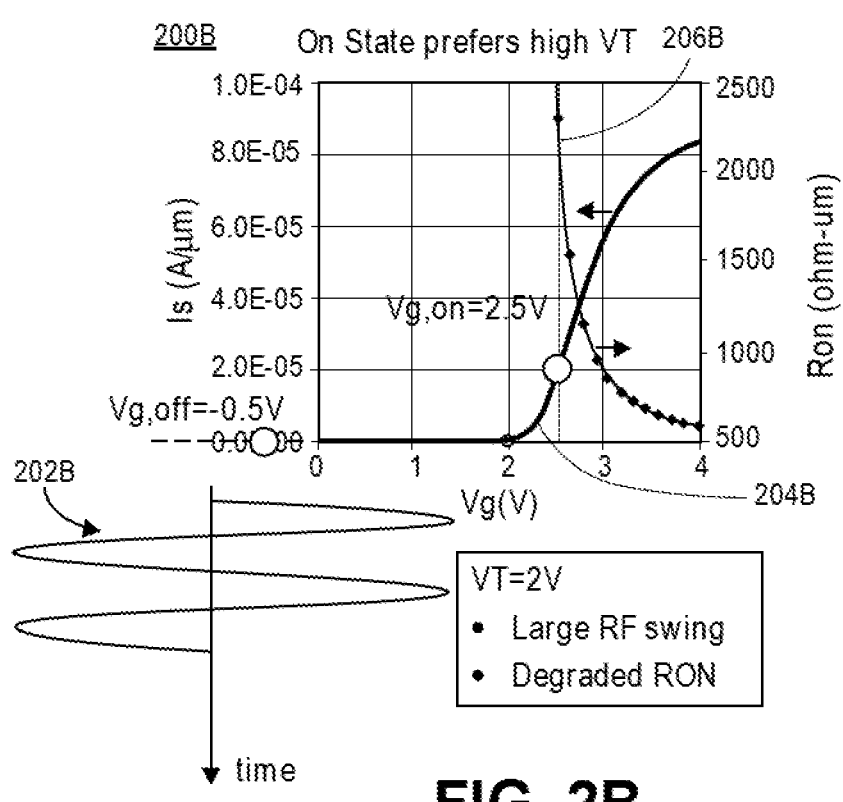
FIG. 2B illustrates a FET Is-Vg curve plot for a conventional FET having a threshold voltage (VT) of 2 V.

FIG. 2B illustrates a FET Is-Vg curve plot 200B for a conventional FET having a threshold voltage (VT) of 2 V. The parameters previously described above for curve plot 200A applies equally to curve plot 200B. The curve plot 200B illustrates that when the FET is biased in OFF state the FET prefers a high VT of 2V. The voltage supply for this RF switch is fixed at −0.5 V for the off-state Vg (Vg,off) and 2.5 V for the on-state Vg (Vg,on). In this example case, the maximum RF swing voltage during the off-state has a peak-to-peak amplitude of 2(VT−Vg,off)=2(2.5 V−(−0.5 V))=2.5 V. A corresponding illustration of the maximum RF swing voltage over time is shown by oscillating curve 202B. Ron is relatively poorer compared to the case in 200A in this example case because of the reduced Vg,on−VT value, which is 2.5 V−2 V=0.5. When the value of Vg rises past the VT value of 2 V, the FET enters ON state, and the Is value shown by curve 204A rises higher than zero. The ON state resistance (Ron) is shown by curve 206B and at Vg,on of 2.5V the Ron is approximately 2500 ohms/μm. However, the maximum RF power handled in the OFF state has increased from 2.5 V to 5 V when compared to the case in 200A as a result in the increase in the VT. However, Ron is degraded because of the small Vg,on−VT value of 2.5 V−2 V=0.5 V. In other words, the increase/improvement in maximum RF power in the second case illustrated in FIG. 2B, as compared to the first case illustrated in FIG. 2A, leads to increased/degraded Ron. As can also be understood, conversely, the decrease/improvement in Ron in the first case as compared to the second case leads to decreased/degraded maximum RF power.

Because VT is fixed, designers must choose between i) an FET having an ON state that prefers low VT and that has a low Ron, but can only handle low maximum RF power (low headroom), or ii) an FET having an OFF state the prefers high VT that can handle high maximum RF power, but has a high Ron (high headroom).

In accordance with one or more embodiments described herein, a transistor having a programmable or variable VT is provided. The transistor can be programmed to have low VT when biased in the ON state to achieve lower on resistance (Ron), and hence lower insertion loss for the RF switch; and can be programmed to have high VT when the transistor is biased in the OFF state to provide larger headroom to handle a higher maximum RF power.

Figure 3:
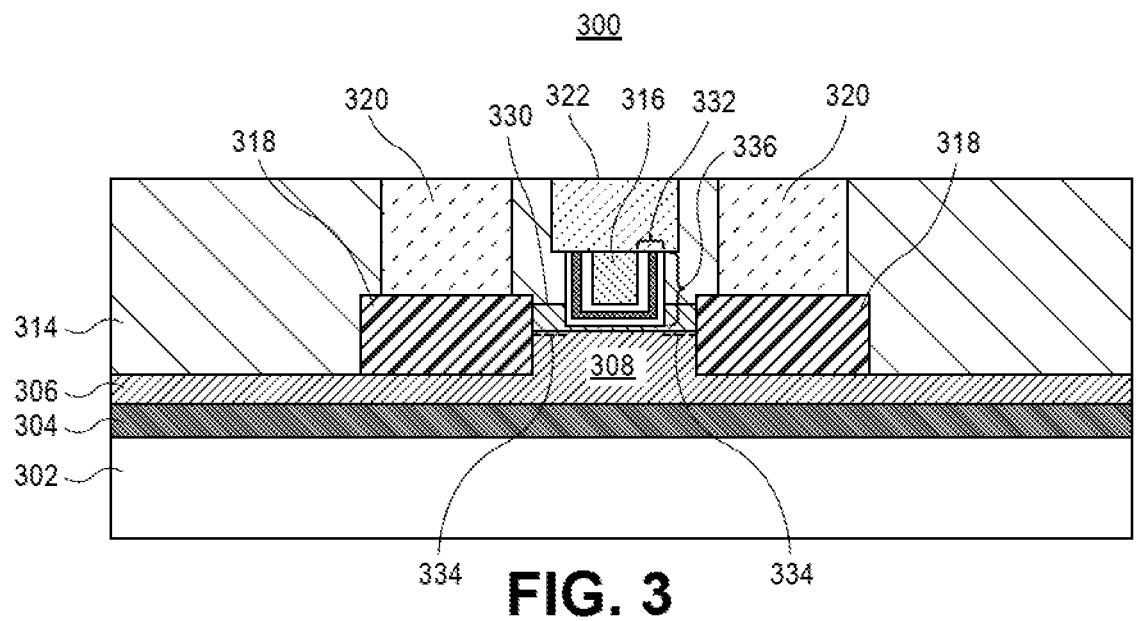
FIG. 3 illustrates a transistor having a programmable VT in accordance with one or more of the disclosed embodiments.

FIG. 3 illustrates a transistor having a programmable VT in accordance with one or more of the disclosed embodiments. In one embodiment, the transistor 300 may be used as an RF switch field-effect transistor (FET) in various components of an RF front end of a mobile device RF and/or RF base stations. The transistor 300 includes a base layer 306 over an optional substrate 302. In this example embodiment, base layer 306 includes a channel region 308. Substrate 302 is optional because in some embodiments, the base layer 306 may be a bulk wafer, such that the base layer 306 is not formed above or on another material substrate but is instead used as the substrate itself, for example. However, in the example stack of layers shown in FIG. 3, substrate 302 is present and base layer 306 is formed above substrate 302.

Base layer 306, in some embodiments, may include any suitable material, including group III-V material (e.g., GaN, GaAs, InGaAs, InGaN), and/or group IV material (e.g., Si, Ge, SiGe, SiC), and/or any other suitable material. In some embodiments, group III element-nitride (III-N) material may be particularly well-suited for base layer 306, as III-N materials have high (or wide) bandgaps and other desirable properties that serve well for the channel material of an RF switch transistor, for example. III-N materials, as variously used herein, include a compound of one or more group III materials (e.g., aluminum, gallium, and/or indium), with nitrogen. Accordingly, III-N materials as variously used herein include, but are not limited to, GaN, InN, AlN, AlInN, AlGaN, InGaN, and AlInGaN. In some embodiments, base layer 306 may have a multilayer structure including multiple material layers. In some embodiments, base layer 306 may or may not include grading (e.g., increasing and/or decreasing) the content of one or more materials in at least a portion of the layer. In some embodiments, base layer 306 may be formed to have a thickness between 10 nm and 2 microns, or any other suitable thickness, depending on the end use or target application. In embodiments where substrate 302 is not present and base layer 306 is a bulk wafer, then base layer 306 may be substantially thicker, such as greater than 100 microns in thickness, for example.

In some embodiments, an optional buffer layer 304 may be located between the base layer 306 and the substrate 302 when present. In the case where or buffer layer 304 is a III-V material and formed on the substrate 102 that is a non-III-V material (e.g., Si, Ge, SiGe, SiC, or sapphire substrate), the buffer layer 304 may act to improve growth conditions and/or prevent the III-V base layer 306 from reacting with the non-III-V substrate material. In one embodiment, the buffer layer 304 may comprise a group III-V nitride in a composition of aluminum, gallium or indium and a group V nitride, e.g. layers of aluminum nitride and aluminum gallium nitride. Further, in such an example embodiment, buffer layer 304 may include a III-V material, such as AlN or a low temperature GaN layer (e.g., epitaxially grown at a temperature in the range of 700 to 950 degrees Celsius), for example. In another example embodiment, buffer layer 304 may include an insulating material in an XOI configuration as previously described, where the insulating layer is sandwiched between base layer 306 and substrate 302 to, for example, reduce parasitic capacitance to the substrate. For instances, in such an example embodiment, an silicon on insulator (SOI) configuration may employ a silicon substrate and a silicon base layer, with an electrically insulating material layer between the silicon layers, where the insulating layer may include silicon dioxide or sapphire, for example. In some such embodiments, where buffer layer 304 is an insulating layer, it may be a buried oxide (BOX) layer, for example. In some embodiments, optional buffer layer 304 may have a multilayer structure including multiple material layers. In some embodiments, optional buffer layer 304 may or may not include grading (e.g., increasing and/or decreasing) the content of one or more materials in at least a portion of the layer. Further, in some such embodiments, buffer layer 304 (where present) may have any suitable thickness, such as a thickness between 0.5 microns and 2 microns, or any other suitable thickness, depending on the end use or target application.

A polarization layer 330 in some embodiments, may be present where base layer 306 includes III-V material, for example. For instance, in the example structure of FIG. 3, polarization layer 330 is present as base layer 306 in that embodiment includes a III-V material. In some such embodiments, polarization layer 330 may include any suitable materials, such as one or more III-V materials, and more specifically in some embodiments, one or more III-N materials including Al, N, In and Ga (e.g., AlN, GaN, InN, AlInN, AlGaN, InGaN, and/or AlInGaN), for example.

In some embodiments, polarization layer 330 may increase carrier mobility in the channel region 308 and/or be used to form two-dimensional electron gas (2DEG) configurations 334 with underlying III-V material layer, for example. Although 2DEG configurations include electron carriers and two-dimensional hole gas (2DHG) configurations 334 including hole carriers, the term 2DEG will be used herein to generally refer to both carrier type configurations (both electron and hole carriers) for ease of description, unless otherwise stated. Therefore, in some instances, the 2DEG configurations 334, when the transistor 300 is in an ON state (as indicated in FIG. 3), may be considered a part of the channel region 308, as the 2DEG configurations 334 (along with channel region 308) allow charge carriers (e.g., electrons or holes) to flow from one source/drain (S/D) region 318 to the other, depending on the end use or target application. In some cases, the thickness and/or composition of polarization layer 330 may affect the magnitude of a polarization vector formed, and thus the amount of charge (and corresponding conductivity) in the 2DEG configurations 334, for example. In some embodiments, polarization layer 330 need not be present, such as in embodiments where the base layer material (and thus, the channel region material) includes group IV semiconductor material, such as Si, Ge, SiGe, or SiC, for example. In some such embodiments, the channel region 308 of base layer 306 may be p-type or n-type doped to help enable the flow of charge carriers when the transistor is in an on-state and/or to help prevent the flow of charge carriers when the transistor is in an off-state, for example. In some embodiments, polarization layer 330 (where present) may have a multilayer structure including multiple material layers. In some embodiments, polarization layer 330 (where present) may or may not include grading (e.g., increasing and/or decreasing) the content of one or more materials in at least a portion of the layer.

In some embodiments, polarization layer 330 (where present) may have a thickness between 0.1 to 100 nm (e.g., 1 to 10 nm), or any other suitable thickness, depending on the end use or target application. For example, the thickness of the polarization layer 330 may be dependent upon on the species of materials used. A polarization layer 330 comprising AlN may have a thickness between 1 to 6 nm. A polarization layer 330 comprising AlGaN may have a thickness between 1 to 30 nm. A polarization layer 330 comprising InAlN may have a thickness between 1 to 15 nm. A polarization layer 330 comprising InAlGaN have a thickness between 1 to 20 nm.

A gate stack 336 is located on or within the polarization layer 330 (where present), and more specifically within a first recess in the polarization layer 330 and within a second recess in an insulating layer 314 that is formed over the transistor 300. The depth of the recess in the polarization layer 330 may be used to control the threshold voltage (VT) of the transistor 300.

In contrast to a conventional RF switch FET that has a fixed VT, the gate stack 336 of the disclosed embodiments includes a composite gate dielectric stack 332 and a gate electrode 316, where the composite gate dielectric stack 332 enables the VT of transistor to be programmable. In one aspect of the disclosed embodiments, instead of a simple one layer of oxide, the composite gate dielectric stack 332 comprises a stack of at least three layers that are conformal to sidewalls of the first and second recesses and the bottom of the first recess formed in the polarization layer 330 to form a generally U-shaped composite gate dielectric stack 332.

Figure 4:
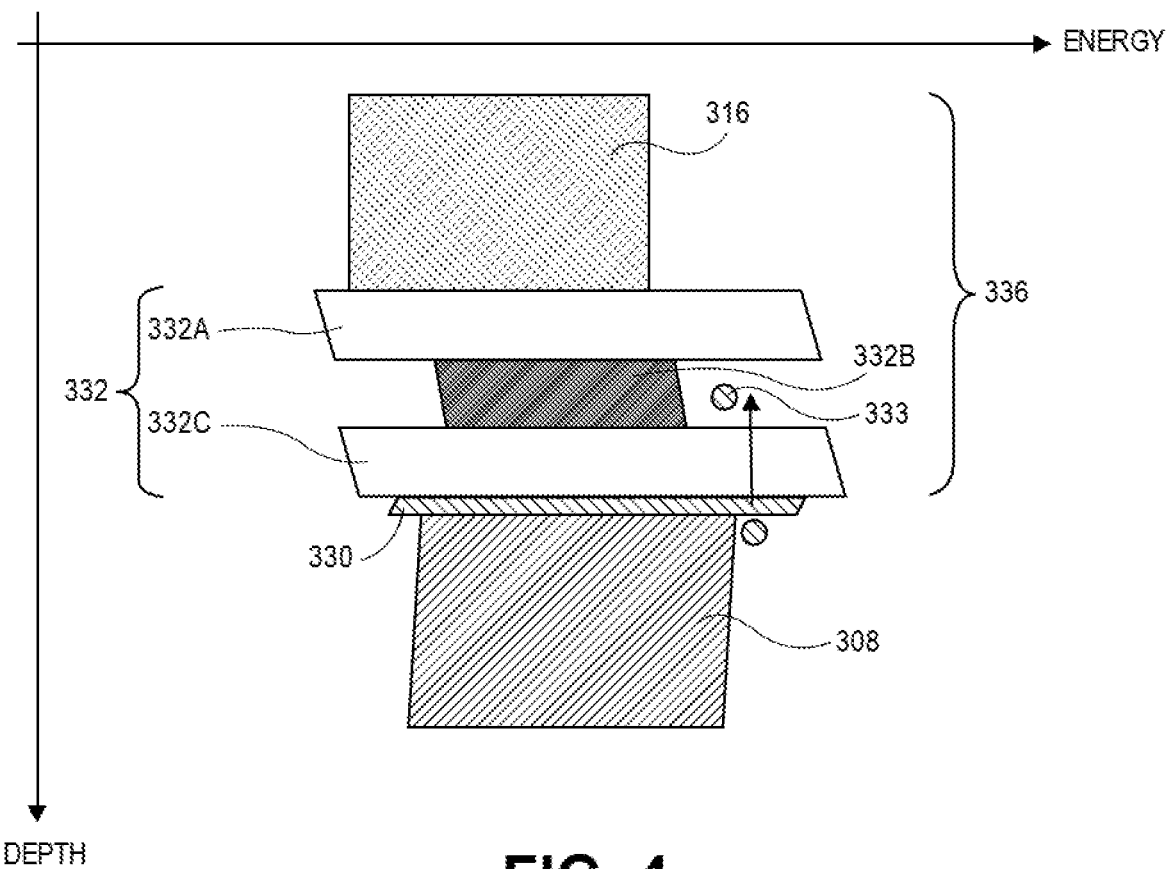
FIG. 4 illustrates an energy band diagram of an enlarged view of a portion of a composite gate stack in the polarization layer between the gate electrode and the channel region.

FIG. 4 illustrates an energy band diagram of an enlarged view of a portion of the composite gate dielectric stack 332 that is conformal to a bottom of the second recess in the polarization layer 330 between the gate electrode 316 and the channel region 308. According to the disclosed embodiments, the composite gate dielectric stack 332 comprises multiple gate oxide layers, e.g., a first large bandgap oxide layer 332A, a low bandgap oxide 332B, and a second large bandgap oxide layer 332C. An energy band diagram is used to illustrate the concept of threshold shifting by charge storage in the low bandgap oxide 332B. In one embodiment, the first large bandgap oxide layer 332A is adjacent to the gate electrode 316, the second large bandgap oxide layer 332C is adjacent to the polarization layer 330 (where present) and the channel region 308, and the low bandgap oxide layer 332B is in-between the first and second large bandgap oxide layers 332A and 332C. When little to no charge is stored in low bandgap oxide layer 332B, the transistor channel has a threshold voltage set by the equilibrium conditions established by the work function of the gate metal and the Fermi level at the transistor channel region 308, for example, threshold voltage is 0.5V in this case. For the following discussion, it is understood that source potential is set at zero volts. When electrons (negative charge) 333 are stored in low bandgap oxide layer 332B by applying a sufficiently large positive gate voltage, Vg, the threshold voltage of the transistor is set at a higher value, e.g., 2V. When the stored electrons 333 are removed by applying either a large negative voltage on the gate electrode 316, and/or a large positive voltage on the drain, the threshold voltage is reset to its original value of, for example, 0.5V.

In one embodiment the first and second large bandgap oxide layers 332A and 332C may comprise SiO2 or SiN, while the low bandgap oxide 332B may comprise a high-k gate dielectric, such as HfO2, TiO2 or ZrO2. The first and second large bandgap oxide layers 332A and 332C may have a thickness between 1 to 10 nm. The low bandgap oxide layer 332B may also have a thickness between 1 to 10 nm. However, each of the first and second large bandgap oxide layers 332A and 332C and the low bandgap oxide layer 332B may each have the same or different thicknesses.

When the transistor is in an on-state, the composite gate dielectric stack 332 is in a first gate dielectric state, thereby effecting a relatively lower threshold voltage (VT,lo). Further, when the transistor is in an off-state (shown in FIG. 4), the composite gate dielectric stack 332 is set to a second gate dielectric state (due to the storage of the electrons 333 that moved from the channel region 308 into the low bandgap oxide layer 332B as indicated with an arrow pointing upward toward the gate electrode 316), thereby effecting a relatively higher threshold voltage (VT,hi), where VT,hi is greater than VT,lo. In some embodiments, this gate stack 336 switching states between a relatively lower threshold voltage (VT,lo) and a higher threshold voltage (VT,hi) provides the mechanism for programming of the VT.

According to another aspect of the disclosed embodiments, the gate stack 336 of the transistor 300 may be programmed to VT,hi before switching to the OFF state by drawing electrons 333 from the channel region 308 to be trapped in the low bandgap oxide layer 332B (indicated with an arrow pointing upward toward the gate electrode 316). The gate stack 336 of the transistor 300 may be programmed to VT,lo before switching to the ON state by expelling any electrons 333 trapped in the low bandgap oxide layer 332B. More specifically, the transistor would be turned on by applying a positive voltage of greater than 4 V to the gate stack 336. In one embodiment, a positive voltage of approximately 7 V would be applied as a pulse to store a charge in the low bandgap oxide layer 332B by pumping electrons 333 from the channel region 308 into the low bandgap oxide layer 332B. To erase this charge, a zero or negative voltage is applied to the gate electrode 316 to first turn-off the gate, biasing the source at zero volts, and biasing the drain at a positive voltage, e.g., 3-5 V. Once the transistor is to be placed in OFF state, another pulse is sent to the transistor, in this case, and an erase pulse, to program the VT to VT,hi, followed by turning the transistor off.

Referring again to FIG. 3, in one embodiment, the gate electrode 316 is formed within the boundaries formed by the composite gate dielectric stack 332. In other words, in this example embodiment, the composite gate dielectric stack 332 is between the gate electrode 316 and the insulating layer 314, such that gate electrode 316 is not directly adjacent to (or in physical contact with the insulating layer 314). Gate electrode 316 may include any suitable material, such as polysilicon, silicon nitride, silicon carbide, and/or various suitable metal material, such as titanium nitride (TiN), aluminum (Al), tungsten (W), titanium (Ti), tantalum (Ta), copper (Cu), or tantalum nitride (TaN), for example. Source/drain regions 318 are formed on opposite sides of the polarization layer 330 and the channel region 308, and may be epitaxially grown from the polarization layer 330. The transistor 300 further includes source/drain contacts 320 and a gate contact 322 formed through the insulating layer 314 and in contact with the source/drain regions 318 and the gate electrode, respectively.

Source and drain (S/D) regions 318, in some embodiments, may be formed using any suitable techniques, depending on the end use or target application. As shown in the example structure of FIG. 3, S/D regions 318 are grown (or regrown) from polarization layer 330 as that layer may have provided a relatively high-quality growth surface, particularly where the S/D regions 318 include III-V material, for example. However, any suitable techniques may have been used to form S/D regions 318. In some embodiments, S/D regions 318 may include any suitable material and any suitable doping scheme, such as being n-type doped or p-type doped using appropriate techniques and materials based on the S/D material and depending on the end use or target application. For example, where base layer 306 includes III-V material, such as GaN or InGaN, S/D regions 318 may both include n-type doped InN or InGaN (e.g., where Si is the n-type dopant). In some embodiments, S/D regions 318 may have a multi-layer structure including multiple material layers. For instance, in some embodiments, a passivation material may be deposited prior to the deposition of the primary S/D material to assist with the quality of the interface between the S/D regions 318 and the base layer 306 material. Further, in some embodiments, a contact-improving material may be formed on the top of the S/D regions 318 to assist with making contact to S/D regions 318 and gate contacts 320 and 322 (described below), for example. In another example embodiment, where base layer 306 includes Si and the transistor device is configured to be a PMOS device, S/D regions 318 may both include p-type doped Si (e.g., where boron is the p-type dopant). In another example embodiment, where base layer 306 includes Si and the transistor device is configured to be an MOS device, S/D regions 318 may both include n-type doped Si (e.g., where phosphorus is the n-type dopant). In some embodiments, S/D regions 318 may include grading (e.g., increasing and/or decreasing) the content of one or more materials in at least a portion of the regions.

S/D regions 318 and gate contacts 320 and 322, in some embodiments, may be formed using any suitable techniques, depending on the end use or target application. In some embodiments, S/D regions 318 and gate contacts 320 and 322 may include any suitable material, such as a conductive metal or alloy (e.g., aluminum, tungsten, silver, titanium, nickel-platinum, or nickel-aluminum). In some embodiments, S/D regions 318 and gate contacts 320 and 322 may include a resistance reducing metal and a contact plug metal, or just a contact plug, depending on the end use or target application. Example contact resistance reducing metals may include silver, nickel, aluminum, titanium, gold, gold-germanium, nickel-platinum, or nickel aluminum, and/or other such resistance reducing metals or alloys. The contact plug metal may include, for instance, aluminum, silver, nickel, platinum, titanium, or tungsten, or alloys thereof, although any suitably conductive contact metal or alloy can be used, depending on the end use or target application. In some embodiments, additional layers may be present in the S/D gate contacts 320, such as adhesion layers (e.g., titanium nitride) and/or liner or barrier layers (e.g., tantalum nitride), if so desired. In some embodiments, metallization of the S/D regions 318 and gate contacts 320 and 322 may be carried out, for example, using an alloying, silicidation, or germanidation process (e.g., generally, deposition of contact metal followed by annealing). Numerous S/D configurations will be apparent in light of this disclosure.

In some embodiments, substrate 302 (where present) may include: a bulk substrate including group IV material, such as silicon (Si), germanium (Ge), SiGe, or silicon carbide (SiC) and/or group III-V material and/or sapphire and/or any other suitable material(s) depending on the end use or target application; an X on insulator (XOI) structure where X is one of the aforementioned materials (e.g., group IV and/or group III-V and/or sapphire) and the insulator material is an oxide material or dielectric material or some other electrically insulating material; or some other suitable multilayer structure where the top layer includes one of the aforementioned materials (e.g., group IV and/or group III-V and/or sapphire). Note that group IV material as used herein includes at least one group IV element (e.g., carbon, silicon, germanium, tin, lead), such as Si, Ge, SiGe, or SiC to name some examples. Note that group III-V material as used herein includes at least one group III element (e.g., aluminum, gallium, indium, boron, thallium) and at least one group V element (e.g., nitrogen, phosphorus, arsenic, antimony, bismuth), such as gallium nitride (GaN), gallium arsenide (GaAs), indium gallium nitride (InGaN), and indium gallium arsenide (InGaAs), to name some examples. Although substrate 302, in this example embodiment, is shown as having a thickness (the vertical dimension or the stack of layers' main axis dimension) similar to the other features for ease of illustration, in some instances, substrate 302 may be much thicker than the other layers, such as having a thickness of 50 to 950 microns, for example. In some embodiments, substrate 302 may be used for one or more other integrated circuit (IC) devices, such as various diodes (e.g., light-emitting diodes (LEDs) or laser diodes), various transistors (e.g., MOSFETs or TFETs), various capacitors (e.g., MOSCAPs), various microelectromechanical systems (MEMS), various nanoelectromechanical systems (NEMS), various sensors, or any other suitable semiconductor or IC devices, depending on the end use or target application. Accordingly, in some embodiments, the transistor structures described herein may be included in a system-on-chip (SoC) application, as will be apparent in light of this disclosure.

The structure of FIG. 3 is primarily depicted and described herein in the context of a planar FET configuration. However, in some embodiments, other transistor configurations can benefit from the techniques described herein. For example, the techniques may be used to form transistors having non-planar configurations, such as finned or finFET configurations (e.g., including a dual-gate or tri-gate configuration) or gate-all-around configurations (e.g., including one or more nanowires or nanoribbons). Further, in some embodiments, the techniques can be used to form numerous different types of transistors, such as MOSFETs, tunnel-FETs (TFETs), high-electron-mobility transistors (HEMTs), or other suitable transistor architectures, depending on the end use or target application. Further yet, in some embodiments, the techniques can be used to form integrated circuits including p-channel and/or n-channel transistor devices, such as p-channel MOSFET (PMOS), n-channel MOSFET (NMOS), p-channel TFET (PTFET), n-channel TFET (NT-FET), p-channel HEMT (PHEMT), and/or n-channel HEMT (NHEMT), to name some examples. Further still, in some embodiments, the techniques may be used to benefit either or both of p-channel and n-channel transistors included in complementary MOS (CMOS) or complementary TFET (CTFET) devices, for example. In some embodiments, the techniques may be used to benefit devices of varying scales, such as transistor devices having critical dimensions in the micrometer range or in the nanometer range (e.g., transistors formed at the 32, 22, 14, 10, 7, or 5 nm process nodes, or beyond).

In one embodiment, a process for fabricating a programmable RF switch transistor may include forming a base layer that includes a channel region, wherein the base layer and the channel region include group III-V semiconductor material. A gate stack is formed above the channel region, where the gate stack comprises a gate electrode, and a composite gate dielectric stack. The composite gate dielectric stack comprises a first large bandgap oxide layer, a low bandgap oxide layer, and a second large bandgap oxide layer. Source and drain regions are formed adjacent to the channel region.

FIGS. 5A-5I illustrates a cross-sectional views showing a process for fabricating a programmable RF switch transistor in further detail according to one example embodiment.

Figure 5A:
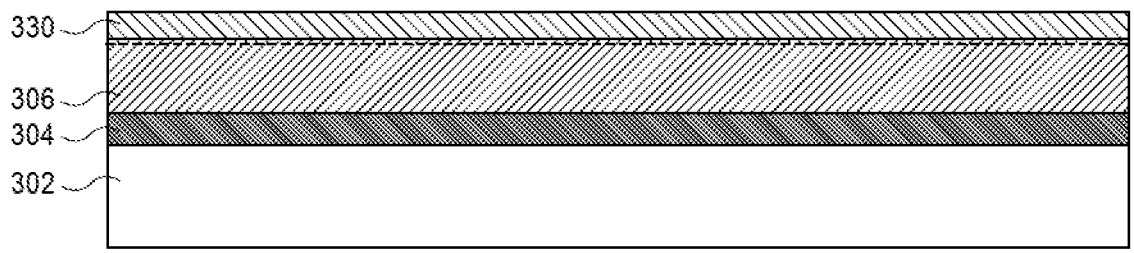
FIGS. 5A-5I illustrates a cross-sectional views showing a process for fabricating a programmable RF switch transistor in further detail according to one example embodiment.
Figure 5B:
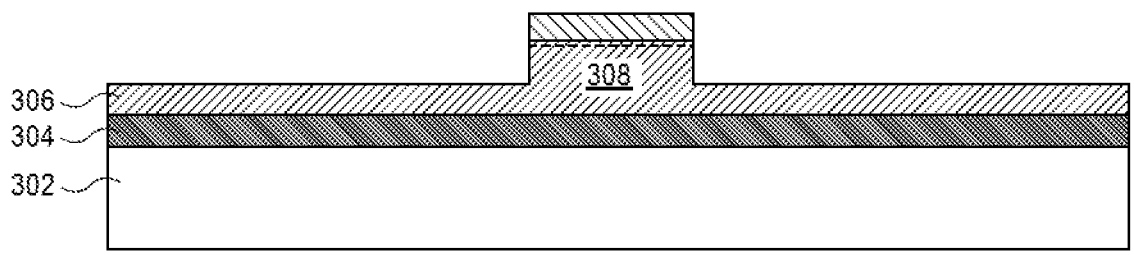
Figure 5C:
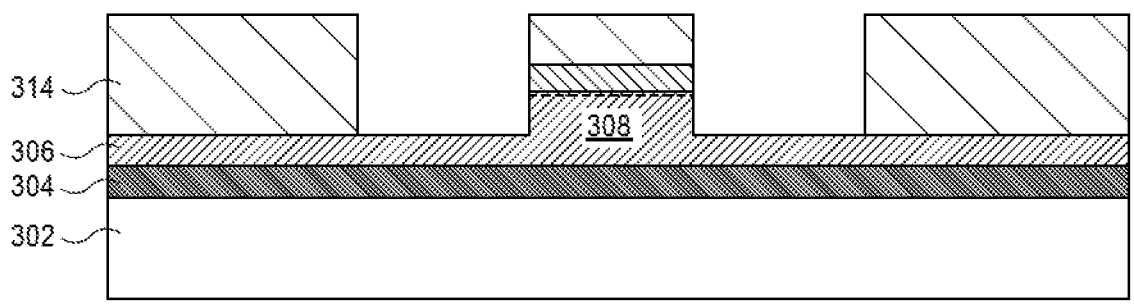
Figure 5D:
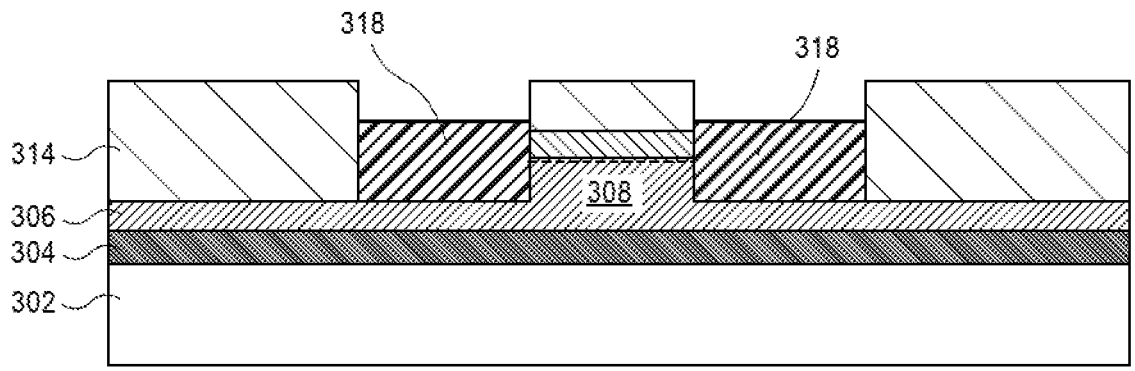
Figure 5E:
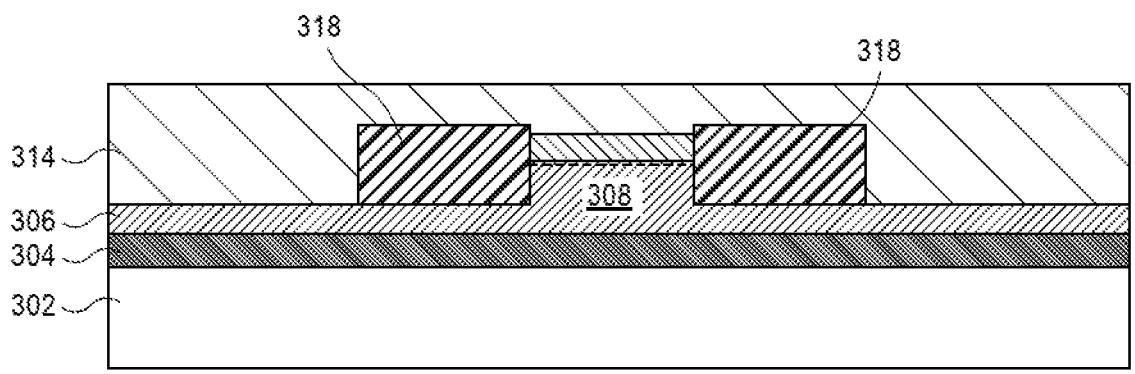
Figure 5F:
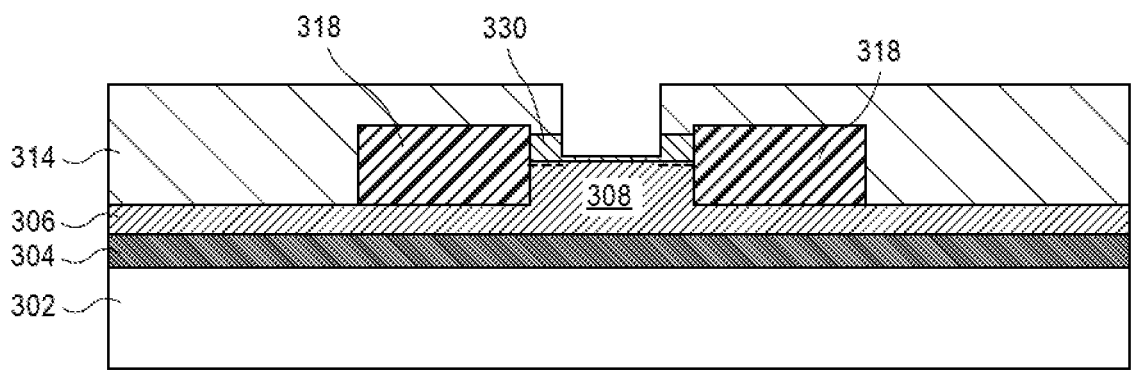

FIG. 5A illustrates the fabrication process after optional buffer layer 304, base layer 306, and optional polarization layer 330 are successively epitaxially grown over the substrate 302. FIG. 5B illustrates the fabrication process after shallow trench isolation is performed to define the channel region 308 and the polarization layer 330 between the channel region 308 and the location for the gate dielectric stack. FIG. 5C illustrates the fabrication process after an insulating layer 314, such as an inter-layer dielectric (ILD), is formed by a blanket deposition, followed by formation of source/drain trenches adjacent to the channel region 308. FIG. 5D illustrates the fabrication process after N+ source/drain regions 318 are formed in the source/drain trenches. FIG. 5E illustrates the fabrication process after an insulating layer is formed over tops of the source/drain regions 318. FIG. 5F illustrates the fabrication process after a gate trench is formed through the insulating layer 314 and the polarization layer 330.

Figure 5G:
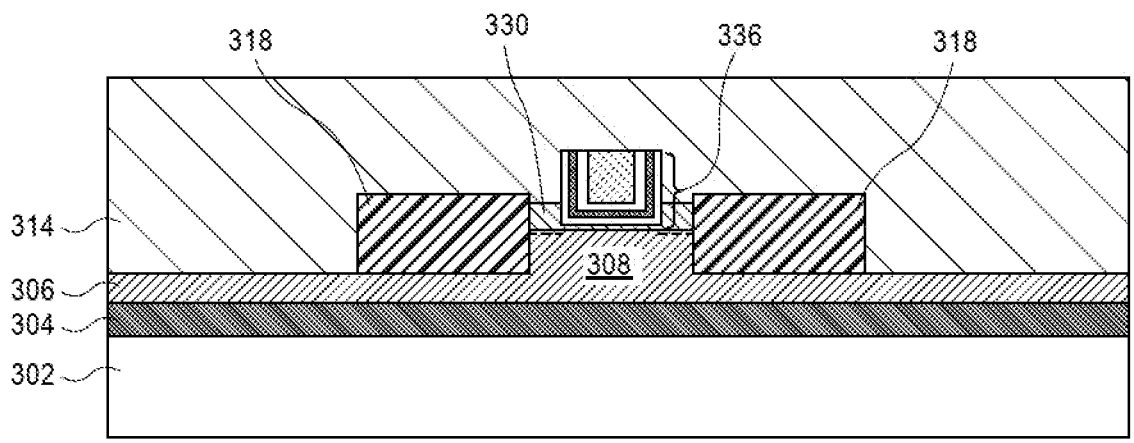
Figure 5H:
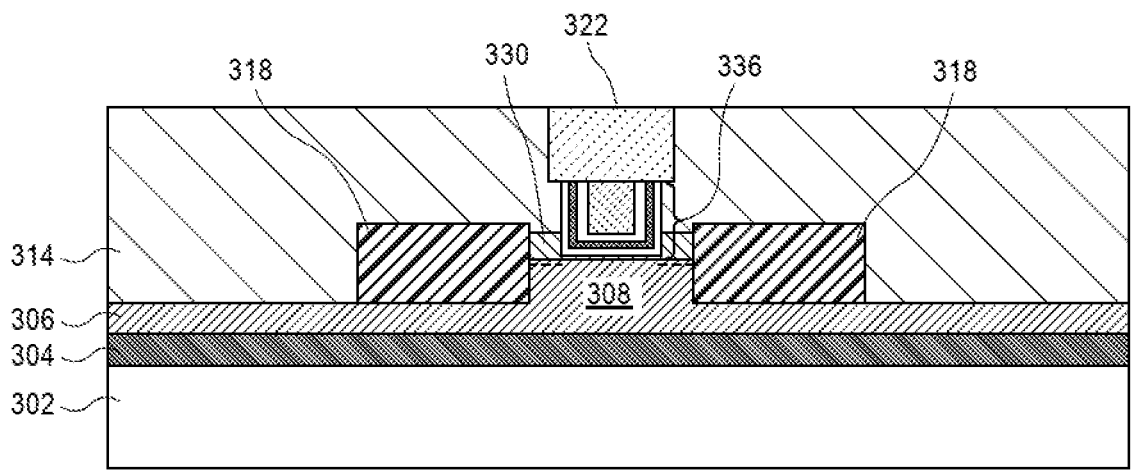
Figure 5I:
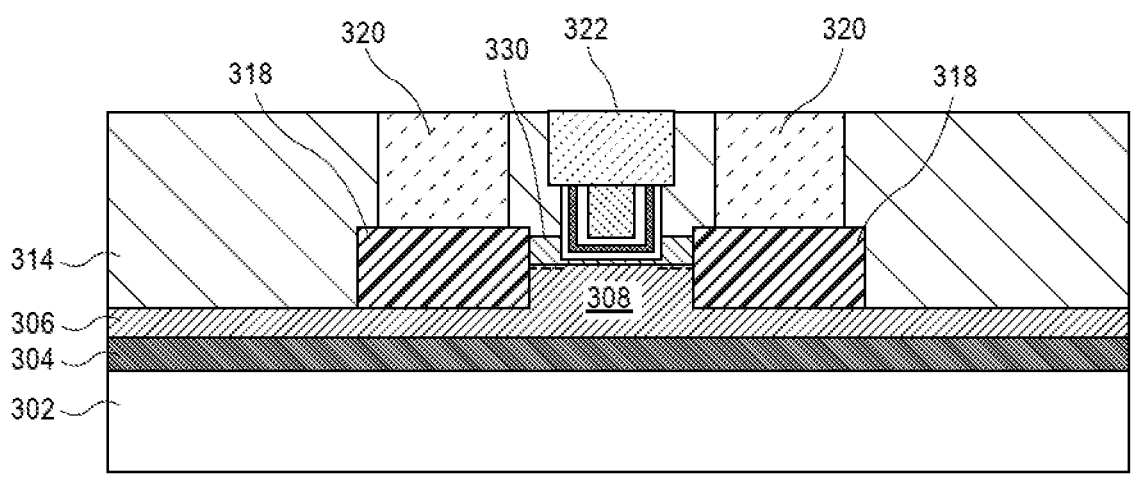

FIG. 5G illustrates the fabrication process after the gate stack 336 is formed in the gate trench. This may include depositing the second large bandgap oxide layer 332C along sidewalls and bottom of the gate trench, depositing the low bandgap oxide 332B on the second large bandgap oxide layer 332C, depositing the first large bandgap oxide layer 332A on the low bandgap oxide 332B, and filling in the remainder of the gate trench with gate electrode material. FIG. 5H illustrates the fabrication process after a gate contact 322 is formed in the insulating layer 314 in contact with the gate stack 336. FIG. 5I illustrates the fabrication process after the source/drain contacts 320 are formed in the insulating layer 314 in contact with the source/drain regions 318.

The integrated circuit structures described herein may be included in an electronic device. As an example of one such apparatus, FIGS. 6A and 6B are top views of a wafer and dies that include one or more integrated programmable gate RF switches, in accordance with one or more of the embodiments disclosed herein.

Figure 6B:
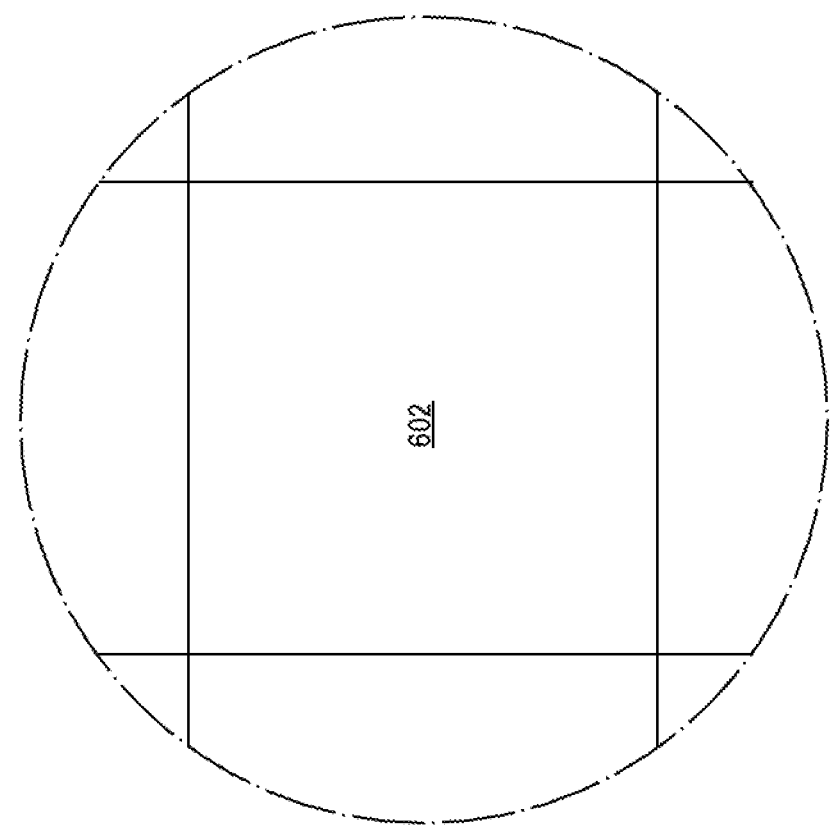
FIGS. 6A and 6B are top views of a wafer and dies that include one or more integrated programmable gate RF switches, in accordance with one or more of the embodiments disclosed herein.
Figure 6A:
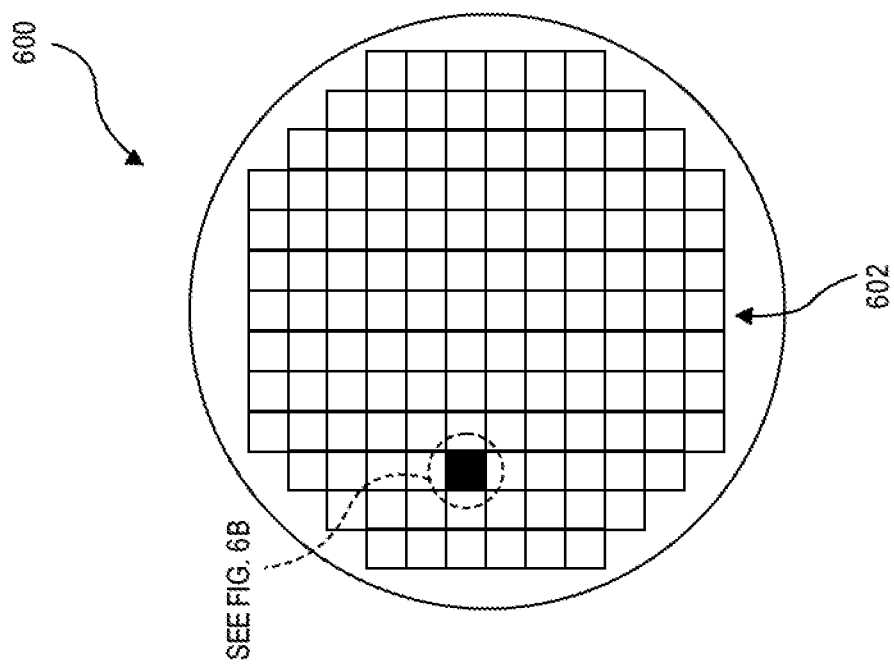

Referring to FIGS. 6A and 6B, a wafer 600 may be composed of semiconductor material and may include one or more dies 602 having integrated circuit (IC) structures formed on a surface of the wafer 600. Each of the dies 602 may be a repeating unit of a semiconductor product that includes any suitable IC (e.g., ICs including one or more integrated programmable gate RF switches, such as described above. After the fabrication of the semiconductor product is complete, the wafer 600 may undergo a singulation process in which each of the dies 602 is separated from one another to provide discrete "chips" of the semiconductor product. In particular, structures that include embedded non-volatile memory structures having an independently scaled selector as disclosed herein may take the form of the wafer 600 (e.g., not singulated) or the form of the die 602 (e.g., singulated). The die 602 may include one or more embedded non-volatile memory structures based independently scaled selectors and/or supporting circuitry to route electrical signals, as well as any other IC components. In some embodiments, the wafer 600 or the die 602 may include an additional memory device (e.g., a static random access memory (SRAM) device), a logic device (e.g., an AND, OR, NAND, or NOR gate), or any other suitable circuit element. Multiple ones of these devices may be combined on a single die 602. For example, a memory array formed by multiple memory devices may be formed on a same die 602 as a processing device or other logic that is configured to store information in the memory devices or execute instructions stored in the memory array.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 7:
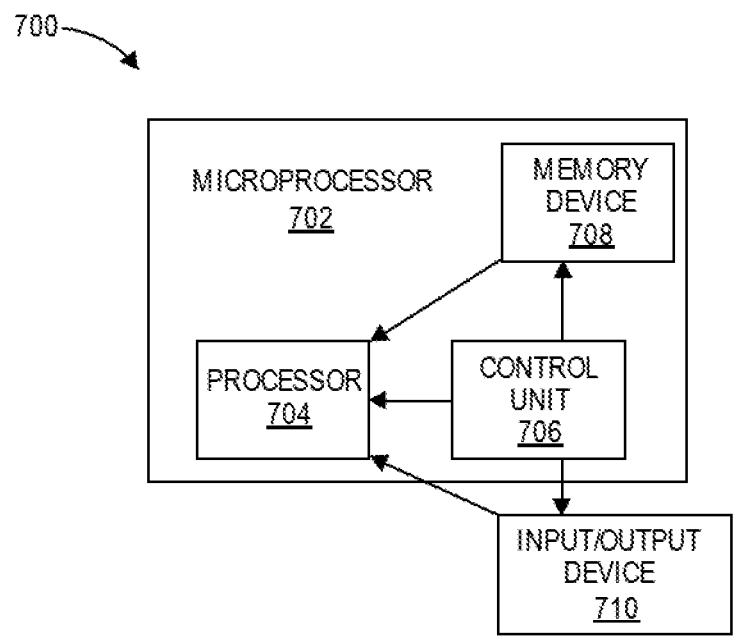
FIG. 7 illustrates a block diagram of an electronic system, in accordance with an embodiment of the present disclosure.

FIG. 7 illustrates a block diagram of an electronic system 700, in accordance with an embodiment of the present disclosure. The electronic system 700 can correspond to, for example, a portable system, a computer system, a process control system, or any other system that utilizes a processor and an associated memory. The electronic system 700 may include a microprocessor 702 (having a processor 704 and control unit 706), a memory device 708, and an input/output device 710 (it is to be appreciated that the electronic system 700 may have a plurality of processors, control units, memory device units and/or input/output devices in various embodiments). In one embodiment, the electronic system 700 has a set of instructions that define operations which are to be performed on data by the processor 704, as well as, other transactions between the processor 704, the memory device 708, and the input/output device 710. The control unit 706 coordinates the operations of the processor 704, the memory device 708 and the input/output device 710 by cycling through a set of operations that cause instructions to be retrieved from the memory device 708 and executed. The memory device 708 can include a non-volatile memory cell as described in the present description. In an embodiment, the memory device 708 is embedded in the microprocessor 702, as depicted in FIG. 7. In an embodiment, the processor 704, or another component of electronic system 700, includes one or more integrated programmable gate RF switches, such as those described herein.

Figure 8:
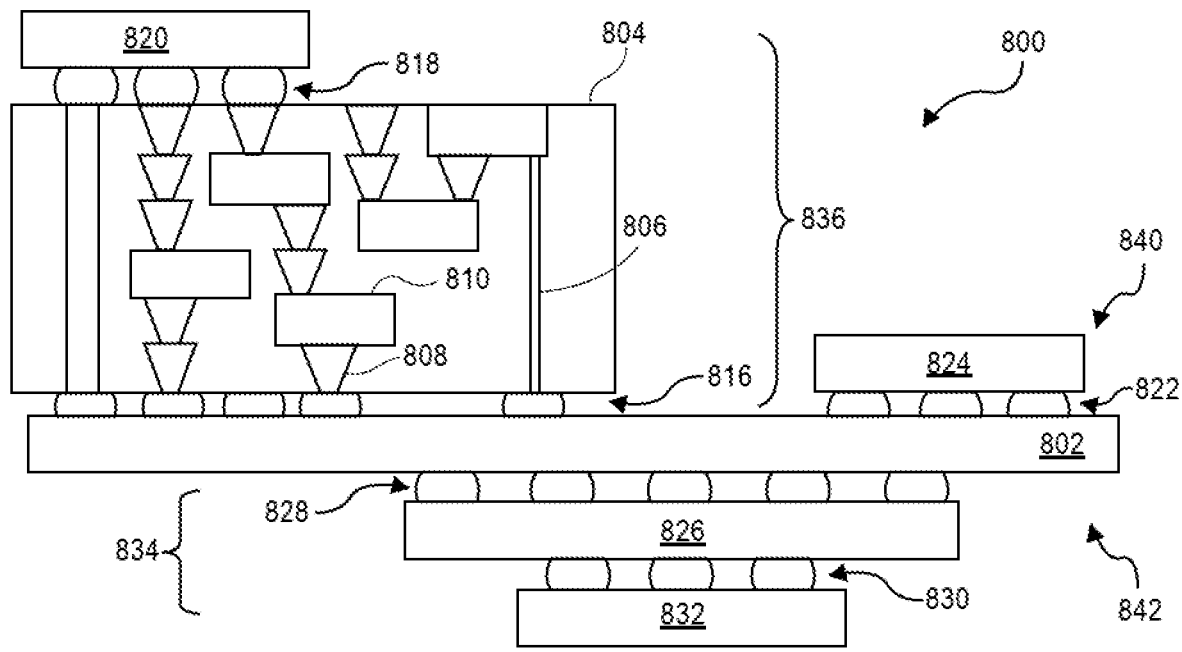
FIG. 8 is a cross-sectional side view of an integrated circuit (IC) device assembly that may include one or more integrated programmable gate RF switches, in accordance with one or more of the embodiments disclosed herein.

FIG. 8 is a cross-sectional side view of an integrated circuit (IC) device assembly that may include one or more integrated programmable gate RF switches, in accordance with one or more of the embodiments disclosed herein.

Referring to FIG. 8, an IC device assembly 800 includes components having one or more integrated circuit structures described herein. The IC device assembly 800 includes a number of components disposed on a circuit board 802 (which may be, e.g., a motherboard). The IC device assembly 800 includes components disposed on a first face 840 of the circuit board 802 and an opposing second face 842 of the circuit board 802. Generally, components may be disposed on one or both faces 840 and 842. In particular, any suitable ones of the components of the IC device assembly 800 may include a number of integrated programmable gate RF switches, such as disclosed herein.

In some embodiments, the circuit board 802 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 802. In other embodiments, the circuit board 802 may be a non-PCB substrate.

The IC device assembly 800 illustrated in FIG. 8 includes a package-on-interposer structure 836 coupled to the first face 840 of the circuit board 802 by coupling components 816. The coupling components 816 may electrically and mechanically couple the package-on-interposer structure 836 to the circuit board 802, and may include solder balls (as shown in FIG. 8), male and female portions of a socket, an adhesive, an underfill material, and/or any other suitable electrical and/or mechanical coupling structure.

The package-on-interposer structure 836 may include an IC package 820 coupled to an interposer 804 by coupling components 818. The coupling components 818 may take any suitable form for the application, such as the forms discussed above with reference to the coupling components 816. Although a single IC package 820 is shown in FIG. 8, multiple IC packages may be coupled to the interposer 804. It is to be appreciated that additional interposers may be coupled to the interposer 804. The interposer 804 may provide an intervening substrate used to bridge the circuit board 802 and the IC package 820. The IC package 820 may be or include, for example, a die (the die 702 of FIG. 7B), or any other suitable component. Generally, the interposer 804 may spread a connection to a wider pitch or reroute a connection to a different connection. For example, the interposer 804 may couple the IC package 820 (e.g., a die) to a ball grid array (BGA) of the coupling components 816 for coupling to the circuit board 802. In the embodiment illustrated in FIG. 8, the IC package 820 and the circuit board 802 are attached to opposing sides of the interposer 804. In other embodiments, the IC package 820 and the circuit board 802 may be attached to a same side of the interposer 804. In some embodiments, three or more components may be interconnected by way of the interposer 804.

The interposer 804 may be formed of an epoxy resin, a fiberglass-reinforced epoxy resin, a ceramic material, or a polymer material such as polyimide. In some implementations, the interposer 804 may be formed of alternate rigid or flexible materials that may include the same materials described above for use in a semiconductor substrate, such as silicon, germanium, and other group III-V and group IV materials. The interposer 804 may include metal interconnects 810 and vias 808, including but not limited to through-silicon vias (TSVs) 806. The interposer 804 may further include embedded devices, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio-frequency (RF) devices, power amplifiers, power management devices, antennas, arrays, sensors, and microelectromechanical systems (MEMS) devices may also be formed on the interposer 804. The package-on-interposer structure 836 may take the form of any of the package-on-interposer structures known in the art.

The IC device assembly 800 may include an IC package 824 coupled to the first face 840 of the circuit board 802 by coupling components 822. The coupling components 822 may take the form of any of the embodiments discussed above with reference to the coupling components 816, and the IC package 824 may take the form of any of the embodiments discussed above with reference to the IC package 820.

The IC device assembly 800 illustrated in FIG. 8 includes a package-on-package structure 834 coupled to the second face 842 of the circuit board 802 by coupling components 828. The package-on-package structure 834 may include an IC package 826 and an IC package 832 coupled together by coupling components 830 such that the IC package 826 is disposed between the circuit board 802 and the IC package 832. The coupling components 828 and 830 may take the form of any of the embodiments of the coupling components 816 discussed above, and the IC packages 826 and 832 may take the form of any of the embodiments of the IC package 820 discussed above. The package-on-package structure 834 may be configured in accordance with any of the package-on-package structures known in the art.

Figure 9:
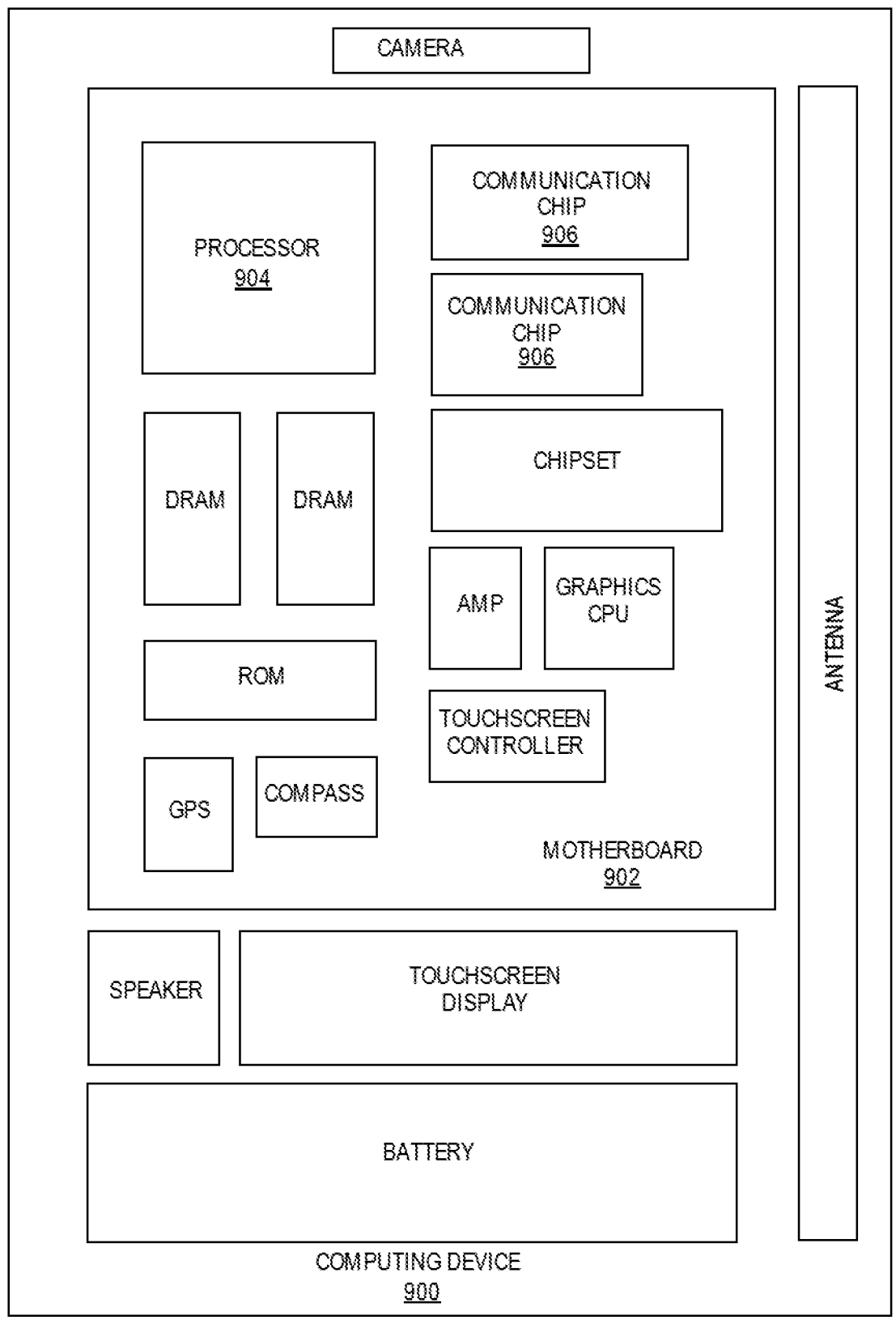
FIG. 9 illustrates a computing device in accordance with one implementation of the disclosure.

FIG. 9 illustrates a computing device 900 in accordance with one implementation of the disclosure. The computing device 900 houses a board 902. The board 902 may include a number of components, including but not limited to a processor 904 and at least one communication chip 906. The processor 904 is physically and electrically coupled to the board 902. In some implementations the at least one communication chip 906 is also physically and electrically coupled to the board 902. In further implementations, the communication chip 906 is part of the processor 904.

Depending on its applications, computing device 900 may include other components that may or may not be physically and electrically coupled to the board 902. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 906 enables wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 906 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 900 may include a plurality of communication chips 906. For instance, a first communication chip 906 may be dedicated to shorter range wireless communications such as Wi-Fi and Bluetooth and a second communication chip 906 may be dedicated to longer range wireless communications such as GPS, EDGE, GPRS, CDMA, WiMAX, LTE, Ev-DO, and others.

The processor 904 of the computing device 900 includes an integrated circuit die packaged within the processor 904. In some implementations of the disclosure, the integrated circuit die of the processor includes one or more integrated programmable gate RF switches, in accordance with implementations of embodiments of the disclosure. The term "processor" may refer to any device or portion of a device that processes electronic data from registers and/or memory to transform that electronic data into other electronic data that may be stored in registers and/or memory.

The communication chip 906 also includes an integrated circuit die packaged within the communication chip 906. In accordance with another implementation of embodiments of the disclosure, the integrated circuit die of the communication chip includes one or more integrated programmable gate RF switches, in accordance with implementations of embodiments of the disclosure.

In further implementations, another component housed within the computing device 900 may contain an integrated circuit die that includes one or more integrated programmable gate RF switches, in accordance with implementations of embodiments of the disclosure.

In various implementations, the computing device 900 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 900 may be any other electronic device that processes data.

Thus, embodiments described herein include integrated programmable gate RF switches.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example Embodiment 1

A transistor comprises a base layer that includes a channel region, wherein the base layer and the channel region include group semiconductor material. A gate stack is above the channel region, the gate stack comprises a gate electrode and a composite gate dielectric stack, wherein the composite gate dielectric stack comprises a first large bandgap oxide layer, a low bandgap oxide layer, and a second large bandgap oxide layer to provide a programmable voltage threshold. Source and drain regions are adjacent to the channel region.

Example Embodiment 2

The transistor of example 1, wherein the base layer and the channel region comprise gallium and nitrogen.

Example Embodiment 3

The transistor of example 1 or 2, wherein the first large bandgap oxide layer is adjacent to the gate electrode, the second large bandgap oxide layer is adjacent to the channel region, and the low bandgap oxide layer is in-between the first large bandgap oxide layer and the second large bandgap oxide layer.

Example Embodiment 4

The transistor of example 1, 2 or 3, wherein the first large bandgap oxide layer and the second large bandgap oxide layer comprise at least one of SiO2 or SiN.

Example Embodiment 5

The transistor of example 1, 2, 3 or 4, wherein the low bandgap oxide layer comprises at least one of HfO2, TiO2 and ZrO2.

Example Embodiment 6

The transistor of example 1, 2, 3, 4 or 5, wherein the first large bandgap oxide layer and the second large bandgap oxide layer have a thickness between 1 to 10 nm.

Example Embodiment 7

The transistor of example 1, 2, 3, 4, 5 or 6, wherein the low bandgap oxide layer has a thickness between 1 to 10 nm.

Example Embodiment 8

The transistor of example 1, 2, 3, 4, 5, 6 or 7, further comprising a polarization layer between the channel region and the composite gate dielectric stack.

Example Embodiment 9

The transistor of example 8, wherein the polarization layer includes aluminum and nitrogen.

Example Embodiment 10

The transistor of example 8, wherein the composite gate dielectric stack is conformal to a bottom of a recess in the polarization layer.

Example Embodiment 11

The transistor of example 1, 2, 3, 4, 5, 6, 7, 8, 9 or 10, wherein the composite gate dielectric stack switches states between a lower threshold voltage (VT,lo) and a higher threshold voltage (VT,hi), where VT,hi is greater than VT,lo.

Example Embodiment 12

The transistor of example 1, 2, 3, 4, 5, 6, 7, 8, 9, 10 or 11, wherein the transistor comprises a radio frequency (RF) switch field effect transistor (FET).

Example Embodiment 13

A programmable radio frequency (RF) switch transistor comprises a base layer that includes a channel region, wherein the base layer and the channel region comprise gallium and nitrogen. A gate stack is above the channel region, the gate stack comprises a gate electrode, and a composite gate dielectric stack, wherein the composite gate dielectric stack comprises a first large bandgap oxide layer, a second large bandgap oxide layer, and a low bandgap oxide layer in-between the first large bandgap oxide layer and the second large bandgap oxide layer. A polarization layer between the channel region and the gate stack; and source and drain (S/D) regions adjacent to the channel region.

Example Embodiment 14

The programmable RF switch transistor of example 13, wherein the first large bandgap oxide layer is adjacent to the gate electrode, and the second large bandgap oxide layer is adjacent to the channel region.

Example Embodiment 15

The programmable RF switch transistor of example 13 or 14, wherein the first large bandgap oxide layer and the second large bandgap oxide layer comprise at least one of SiO2 or SiN.

Example Embodiment 16

The programmable RF switch transistor of example 13, 14 or 15, wherein the low bandgap oxide layer comprises at least one of HfO2, TiO2 and ZrO2.

Example Embodiment 17

The programmable RF switch transistor of example 13, 14, 15 or 16, wherein the first large bandgap oxide layer and the second large bandgap oxide layer have a thickness between 1 to 10 nm.

Example Embodiment 18

The programmable RF switch transistor of example 13, 14, 15, 16 or 17, wherein the low bandgap oxide layer has a thickness between 1 to 10 nm.

Example Embodiment 19

The programmable RF switch transistor of example 13, 14, 15, 16, 17 or 18, wherein the polarization layer includes aluminum and nitrogen.

Example Embodiment 20

The programmable RF switch transistor of example 13, 14, 15, 16, 17, 18 or 19, wherein the composite gate dielectric stack is conformal to a bottom of a recess in the polarization layer.

Example Embodiment 21

The programmable RF switch transistor of example 13, 14, 15, 16, 17, 18, 19 or 20, wherein the composite gate dielectric stack switches states between a lower threshold voltage (VT,lo) and a higher threshold voltage (VT,hi), where VT,hi is greater than VT,lo.

Example Embodiment 22

A method of fabricating a memory device, the method comprises forming a base layer that includes a channel region, wherein the base layer and the channel region include group III-V semiconductor material. A gate stack is formed above the channel region, the gate stack comprising a gate electrode, and a composite gate dielectric stack, wherein the composite gate dielectric stack comprises a first large bandgap oxide layer, a low bandgap oxide layer, and a second large bandgap oxide layer. Source and drain regions are formed adjacent to the channel region.

Example Embodiment 23

The method of example 2222, wherein forming the gate stack further comprises: depositing the second large bandgap oxide layer along sidewalls and bottom of a gate trench; depositing the low bandgap oxide layer on the second large bandgap oxide layer; depositing the first large bandgap oxide layer on the low bandgap oxide layer; and filling in a remainder of the gate trench with gate electrode material.

Example Embodiment 24

The method of example 22 or 23, further comprising forming a polarization layer between the channel region and the composite gate dielectric stack.

Example Embodiment 25

The method of example 22, 23 or 24, further comprising forming the first large bandgap oxide layer and the second large bandgap oxide layer using at least one of SiO2 or SiN, and forming the low bandgap oxide layer using at least one of HfO2, TiO2 and ZrO2.

What is claimed is:

1. A radio frequency (RF) switch transistor, comprising:
   a base layer that includes a channel region, the channel region rising above the base layer, wherein the base layer and the channel region include group III-V semiconductor material;
   a polarization layer over the channel region, the polarization layer having a first recess in a top of the polarization layer;
   an insulating layer over the polarization layer, the insulating layer having a second recess over the first recess;
   a gate stack located within the first recess in the polarization layer and within the second recess in the insulating layer above the channel region, the gate stack comprising a gate electrode, and a composite gate dielectric stack, wherein the composite gate dielectric stack comprises a first large bandgap oxide layer, a low bandgap oxide layer, and a second large bandgap oxide layer, the composite gate dielectric stack conformal to sidewalls of the first and second recesses and a bottom of the first recess in the polarization layer, wherein the low bandgap oxide layer comprises at least one of HfO2, TiO2 and ZrO2, wherein a depth of the first recess controls a threshold voltage (VT) of the RF switch transistor; and
   source and drain regions adjacent to the channel region.

2. The transistor of claim 1, wherein the base layer and the channel region comprise gallium and nitrogen.

3. The transistor of claim 1, wherein the first large bandgap oxide layer is adjacent to the gate electrode, the second large bandgap oxide layer is on the polarization layer adjacent to the channel region, and the low bandgap oxide layer is in-between the first large bandgap oxide layer and the second large bandgap oxide layer.

4. The transistor of claim 1, wherein the first large bandgap oxide layer and the second large bandgap oxide layer comprise at least one of SiO2 or SiN.

5. The transistor of claim 1, wherein the first large bandgap oxide layer and the second large bandgap oxide layer have a thickness between 1 to 10 nm.

6. The transistor of claim 1, wherein the low bandgap oxide layer has a thickness between 1 to 10 nm.

7. The transistor of claim 1, wherein the polarization layer includes aluminum and nitrogen.

8. The transistor of claim 1, wherein the composite gate dielectric stack switches states between a lower threshold voltage (VT,lo) and a higher threshold voltage (VT,hi), where VT,hi is greater than VT,lo.

9. A programmable radio frequency (RF) switch transistor comprising:
   a base layer that includes a channel region, the channel region rising above the base layer, wherein the base layer and the channel region comprise gallium and nitrogen;
   a polarization layer over the channel region, the polarization layer having a first recess in a top of the polarization layer;
   an insulating layer over the polarization layer, the insulating layer having a second recess over the first recess;
   a gate stack located within the first recess in the polarization layer and within the second recess in the insulating layer above the channel region, the gate stack comprising a gate electrode, and a composite gate dielectric stack, wherein the composite gate dielectric stack comprises a first large bandgap oxide layer, a second large bandgap oxide layer, and a low bandgap oxide layer in-between the first large bandgap oxide layer and the second large bandgap oxide layer, the composite gate dielectric stack conformal to sidewalls of the first and second recesses and a bottom of the first recess in the polarization layer, wherein the low bandgap oxide layer comprises at least one of HfO2, TiO2 and ZrO2, wherein a depth of the first recess controls a threshold voltage (VT) of the RF switch transistor; and source and drain (S/D) regions adjacent to the channel region.

10. The programmable RF switch transistor of claim 9, wherein the first large bandgap oxide layer is adjacent to the gate electrode, and the second large bandgap oxide layer is on the polarization layer adjacent to the channel region.

11. The programmable RF switch transistor of claim 9, wherein the first large bandgap oxide layer and the second large bandgap oxide layer comprise at least one of SiO2 or SiN.

12. The programmable RF switch transistor of claim 9, wherein the first large bandgap oxide layer and the second large bandgap oxide layer have a thickness between 1 to 10 nm.

13. The programmable RF switch transistor of claim 9, wherein the low bandgap oxide layer has a thickness between 1 to 10 nm.

14. The programmable RF switch transistor of claim 9, wherein the polarization layer includes aluminum and nitrogen.

15. The programmable RF switch transistor of claim 9, wherein the composite gate dielectric stack switches states between a lower threshold voltage (VT,lo) and a higher threshold voltage (VT,hi), where VT,hi is greater than VT,lo[ ].

16. A method of fabricating a radio frequency (RF) switch transistor, the method comprising:

forming a base layer that includes a channel region, the channel region rising above the base layer, wherein the base layer and the channel region include group III-V semiconductor material;

forming a polarization layer over the channel region, the polarization layer having a first recess in a top of the polarization layer;

forming an insulating layer over the polarization layer, the insulating layer having a second recess over the first recess forming a gate stack located within the first recess in the polarization layer and within the second recess in the insulating layer above the channel region, the gate stack comprising a gate electrode, and a composite gate dielectric stack, wherein the composite gate dielectric stack comprises a first large bandgap oxide layer, a low bandgap oxide layer, and a second large bandgap oxide layer, the composite gate dielectric stack conformal to sidewalls of the first and second recesses and a bottom of the first recess in the polarization layer, wherein the low bandgap oxide layer comprises at least one of HfO2, TiO2 and ZrO2, wherein a depth of the first recess controls a threshold voltage (VT) of the RF switch transistor; and forming source and drain regions adjacent to the channel region.

17. The method of claim 16, wherein forming the gate stack further comprises:

depositing the second large bandgap oxide layer along sidewalls and bottom of a gate trench;

depositing the low bandgap oxide layer on the second large bandgap oxide layer;

depositing the first large bandgap oxide layer on the low bandgap oxide layer; and filling in a remainder of the gate trench with gate electrode material.

18. The method of claim 16, further comprising forming the first large bandgap oxide layer and the second large bandgap oxide layer using at least one of SiO2 or SiN.

* * * * *